United States Patent
Tee et al.

(10) Patent No.: US 10,218,341 B2
(45) Date of Patent: Feb. 26, 2019

(54) SYSTEMS AND METHODS FOR PHASE SYNCHRONIZATION OF LOCAL OSCILLATOR PATHS IN OSCILLATOR-OPERATED CIRCUITS

(71) Applicant: Marvell World Trade Ltd., St. Michael (BB)

(72) Inventors: Luns Tee, Berkeley, CA (US); Wanghua Wu, Santa Clara, CA (US); Xiang Gao, Fremont, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 15/812,780

(22) Filed: Nov. 14, 2017

(65) Prior Publication Data

US 2018/0138899 A1 May 17, 2018

Related U.S. Application Data

(60) Provisional application No. 62/421,469, filed on Nov. 14, 2016.

(51) Int. Cl.
| | |
|---|---|
| *H03K 5/135* | (2006.01) |
| *H03L 7/099* | (2006.01) |
| *H03L 7/10* | (2006.01) |
| *H03L 7/18* | (2006.01) |
| *H03L 7/197* | (2006.01) |
| *H03L 7/23* | (2006.01) |

(52) U.S. Cl.
CPC .......... *H03K 5/135* (2013.01); *H03L 7/0992* (2013.01); *H03L 7/10* (2013.01); *H03L 7/18* (2013.01); *H03L 7/1974* (2013.01); *H03L 7/1976* (2013.01); *H03L 7/23* (2013.01); *H03L 2207/06* (2013.01); *H03L 2207/12* (2013.01)

(58) Field of Classification Search
CPC ... H03K 5/135; H03L 7/0992; H03L 2207/12; H03L 2207/06; H03L 7/10; H03L 7/18; H03L 7/1974; H03L 7/1976
See application file for complete search history.

(56) References Cited

U.S. PATENT DOCUMENTS

| | | | |
|---|---|---|---|
| 7,451,337 B1 * | 11/2008 | Hewitt | G06F 1/10 713/400 |
| 7,463,710 B2 | 12/2008 | Walsh et al. | |
| 8,810,290 B1 | 8/2014 | Cloutier et al. | |
| 2006/0267640 A1 * | 11/2006 | Travis | G06F 1/025 327/105 |
| 2007/0247233 A1 | 10/2007 | Keaveney | |
| 2008/0055485 A1 * | 3/2008 | Elnathan | H03L 7/06 348/723 |
| 2015/0263742 A1 * | 9/2015 | McLaurin | H03L 7/085 327/158 |

* cited by examiner

*Primary Examiner* — Syed Haider

(57) ABSTRACT

Embodiments described herein provide a system having phase synchronized local oscillator paths. The system includes a first circuit, which in turn includes a first counter configured to generate a first counter output signal in response to a first clock signal controlling the first counter. The first circuit also includes a first phase-locked loop coupled to the first counter. The first phase-locked loop is configured to receive the first counter output signal as a first synchronization clock for the first phase-locked loop and to generate a first output signal having rising edges aligned according to the first counter output signal.

16 Claims, 6 Drawing Sheets

SYSTEMS AND METHODS FOR PHASE SYNCHRONIZATION OF LOCAL OSCILLATOR PATHS IN OSCILLATOR-OPERATED CIRCUITS

CROSS-REFERENCE TO RELATED APPLICATION

This disclosure claims the benefit under 35 U.S.C. § 119(e) of U.S. Provisional Patent Application No. 62/421,469, filed Nov. 14, 2016, which is hereby incorporated by reference herein in its entirety.

FIELD OF USE

This disclosure relates to phase-locked loop (PLL) circuits, and specifically, to systems and methods for phase synchronization of local oscillator paths in oscillator-operated circuits.

BACKGROUND OF THE DISCLOSURES

The background description provided herein is for the purpose of generally presenting the context of the disclosure. Work of the inventors hereof, to the extent the work is described in this background section, as well as aspects of the description that does not otherwise qualify as prior art at the time of filing, are neither expressly nor impliedly admitted to be prior art against the present disclosure.

Circuits typically employ oscillators to generate clock signals, e.g., in frequency synthesizers, serializers, deserializers, etc. As circuit components are operated under different clock signals, phase synchronization among different local oscillator (LO) paths on one circuit chip or on multiple circuit chips is often required. A LO path usually includes a fractional-N PLL, e.g., the frequency of the output clock signal is equivalent to the frequency of the input clock signal multiplied by a non-integer value, and the distribution circuits include dividers and buffers. The dividers can sometimes introduce phase ambiguity among different PLLs although a reference clock is shared among the different PLLs.

For example, in a wireless multiple-input multiple-output (MIMO) system, multiple transmitting and receiving signal paths need to be in-phase. At times, different dividers are used at different MIMO channels, which introduce phase ambiguity such that phases of the transmission signals at the different MIMO channels are not aligned. Sometimes a single PLL is used to track and lock the phases of transmission signals for all MIMO channels so that phase is synchronized across different MIMO channels have. However, for circuits of a larger size, using one single PLL for all MIMO channels requires a significant amount of wiring. On the other hand, when multiple PLLs are used, phase synchronization between the multiple PLLs on one circuit chip or between PLLs on multiple circuit chips can sometimes be implemented through a shared reference clock such that the phases at different oscillator outputs of the different PLLs are synchronized. However, even when the multiple PLLs share the same reference clock, the individual divider at each PLL can still introduce an incoherent state to the phases, thereby resulting in phase ambiguities in the LO paths on the circuit chip.

SUMMARY

Embodiments described herein provide a system having phase synchronized local oscillator paths. The system includes a first circuit, which in turn includes a first counter configured to generate a first counter output signal in response to a first clock signal controlling the first counter. The first circuit also includes a first phase-locked loop coupled to the first counter. The first phase-locked loop is configured to receive the first counter output signal as a first synchronization clock for the first phase-locked loop and to generate a first output signal having rising edges aligned according to the first counter output signal.

In some implementations, the first phase-locked loop circuit includes an oscillator configured to generate an oscillator clock, a multi-modulus divider configured to divide the oscillator clock by a non-integer value to match a reference frequency, and a first sigma-delta modulator. The first sigma-delta modulator includes a multiplier configured to generate a multiplier output signal representing a product of a fractional part of a frequency control word and the first counter output signal, and an adder. The adder is configured to generate a sum of an integer part of the frequency control word and the generated product of the fractional part of the frequency control word and the counter value corresponding to the first counter output signal, send the generated sum as a division ratio to the multi-modulus divider.

In some implementations, the first circuit includes a second phase-locked loop coupled to the first counter. The second phase-locked loop is configured to receive the first counter output signal as a second synchronization clock and generate a second output signal having rising edges aligned according to the first counter output signal.

In some implementations, the first circuit includes a second counter configured to receive the first clock signal as an input clock and to generate a second counter output signal according to the first clock signal. The first circuit further includes a second phase-locked loop coupled to the second counter. The second phase-locked loop is configured to receive the second counter output signal, the second counter output signal serving as a second synchronization clock for the second phase-locked loop, and to generate a second output signal having rising edges aligned according to the second counter output signal.

In some implementations, the first counter output signal is sampled to match a modulator clock signal controlling the first sigma-delta modulator when a frequency of the first counter output signal and a frequency of the modulator clock signal are different.

In some implementations, the first counter is implemented as a multi-bit counter. The first counter is configured to generate the first counter output signal in response to the first clock signal irrespective of whether the first phase-locked loop is powered on or powered off.

In some implementations, the multiplier is configured to multiply a number of least significant bits of the integer part of the frequency control word and the fractional part of the frequency control word with the counter value corresponding to the first counter output signal to generate a sigma-delta modulator output. The first circuit further includes one or more serially connected half-dividers configured to divide the oscillator clock signal consecutively. The first circuit further includes a comparator configured to compare a phase corresponding to a feedback signal derived from the serially divided oscillator clock signal with a phase corresponding to the sigma-delta modulator output to generate an error component indicative of a phase difference between the feedback signal and the sigma-delta modulator output. The adder is configured to add the integer part of the frequency control word excluding a number of least significant bits of the integer part of the frequency control word, the sigma-delta modulator output and the error component to generate the division ratio for the multi-modulus divider.

In some implementations, the number of least significant bits of the integer part of the frequency control word that are combined with the fractional part of the frequency control word is determined by a number of the one or more serially connected half-dividers used to divide the oscillator clock signal.

In some implementations, the first circuit further includes one or more flip-flops governed by a feedback clock, the one or more flip-flops being configured to sample the serially divided oscillator clock signal according to the feedback clock to generate the feedback signal. The first phase-locked loop circuit is further configured to divide the oscillator clock signal by the division ratio, and sample the divided oscillator clock signal with the same feedback clock.

In some implementations, the system further includes a second circuit, which in turn includes a second counter configured to generate a second counter output signal in response to a second clock signal controlling the second counter. The second circuit further includes a second phase-locked loop coupled to the second counter. The second phase-locked loop is configured to receive the second counter output signal as a second synchronization clock and generate a second output signal having rising edges aligned according to the second counter output signal. The system further includes a reset component coupled to the first circuit and the second circuit. The reset component is configured to send a same reset signal to synchronize the first counter on the first circuit and the second counter on the second circuit.

Embodiments described herein provide a method for phase synchronization in local oscillator paths. A first counter output signal is generated, at a first counter disposed on a first circuit, in response to a first clock signal controlling the first counter. The first counter output signal is received, at a first phase-locked loop disposed on the first circuit, as a first synchronization clock for the first phase-locked loop. A first output signal having rising edges aligned according to the first counter output signal is generated.

BRIEF DESCRIPTION OF THE DRAWINGS

Further features of the disclosure, its nature and various advantages will become apparent upon consideration of the following detailed description, taken in conjunction with the accompanying drawings, in which like reference characters refer to like parts throughout, and in which.

DETAILED DESCRIPTION

This disclosure describes methods and systems for phase synchronization of local oscillator paths in oscillator-operated circuits. A circuit that employs more than one PLL typically faces the challenge to synchronize the various PLL output signals to a reference clock, as different oscillators employed in different PLLs cause phase ambiguities. In addition, in a fractional-N generation PLL, which usually employs a sigma-delta modulator (SDM) to generate a division ratio for the multi-modulus divider (MMDIV), as further illustrated in FIG. 3, the MMDIV output and the SDM operation both need to be synchronized to the same reference clock of the PLL.

Figure 1:
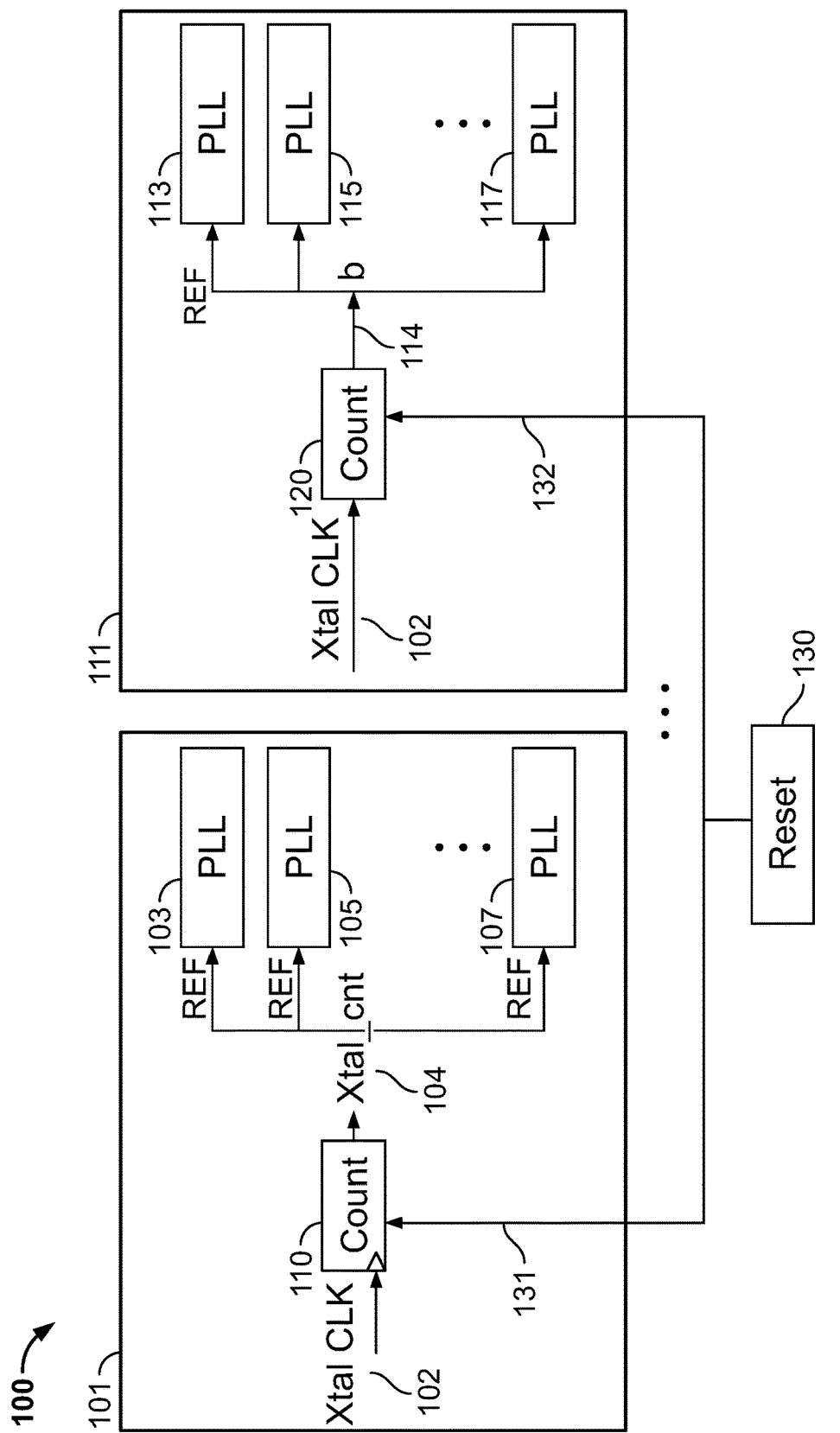
FIG. 1 is a block diagram illustrating an example circuit using a counter to generate a phase reference signal, according to some embodiments described herein.
Figure 2:
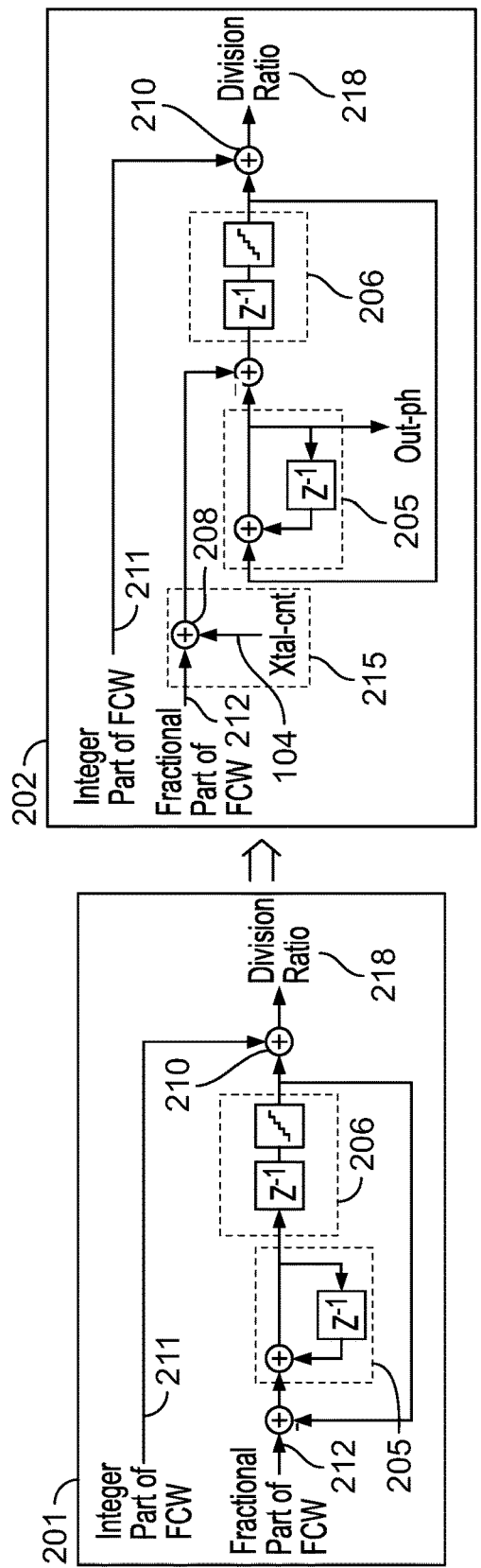
FIG. 2 is a block diagram illustrating an example sigma-delta modulator (SDM) using a counter output signal, as generated from the counter shown in FIG. 1, to synchronize the phase of the fractional part of a division signal, according to some embodiments described herein.

Embodiments described herein provides a counter, for instance a crystal counter that includes a voltage-controlled oscillator (VCO) or digitally-controlled oscillator (DCO) generating a clock signal that operates the counter. The counter is subsequently used to generate a counter output signal as a "golden" phase reference to synchronize oscillator phases of PLLs on the circuit as shown in FIG. 1. The phase reference is also used to control the SDM within a fractional-N PLL on a circuit (as shown in FIG. 2), and to control the phase of the divider output of the PLL (as shown in FIG. 4). In this way, as long as the multiple PLLs share the same phase reference, the output phases of the PLLs are synchronized. The phase synchronization described herein (as shown in FIGS. 1-4) requires little hardware overhead, e.g., by adding only a low-power crystal clock counter and minimal modification in the SDM.

FIG. 1 is a block diagram illustrating an example circuit 100 using a counter 110 or 120 to generate a phase reference signal, according to some embodiments described herein. A circuit chip 101 includes multiple PLLs 103, 105, 107, etc. in an embodiment. Each PLL 103, 105 or 107 receives a reference clock to lock the frequency and/or phase of the output clock signal of the PLL, e.g., the phase of the output clock signal is fixed relative to the phase of the reference clock. By fixating the phase of the output clock signal, the output clock signal of the PLL is "locked" to the reference clock.

A crystal counter 110, operated by a clock signal 102 that is generated by a crystal oscillator (not shown), is disposed on the circuit chip 101. For example, the crystal counter 110 can be implemented as a multi-bit ripple counter. The ripple counter usually includes a number of serially connected latches, and the first latch is controlled by the clock signal 102, and the subsequent latches are each controlled by the output of the preceding latch. The crystal counter 110 is configured to generate a counter output signal 104, which forms rising edges as the counter accumulates. Thus, the crystal counter 110 creates "golden" time stamps for phase synchronization. Sometimes the counter output signal 104 from the counter 110 includes a counting error due to the propagation delay between the input clock signal 102 and the counter output signal 104. Further description on correcting the propagation delay induced error in a counter output signal can be found in co-pending and commonly-assigned U.S. application Ser. No. 15/812,797, filed on the same day, which is hereby expressly incorporated by reference in its entirety.

As shown at reference numeral 101, for PLLs 103, 105, 107, etc. on one circuit chip, only one counter 110 is used and the counter output signal 104 is distributed to multiple PLLs 103, 105, 107, etc., and used as the reference clock by each PLL. Thus, in the example of FIG. 1, the outputs of PLLs 103, 105, 107, etc., on the circuit chip 101 are all synchronized as the PLL outputs are all "locked" to the same reference clock, e.g., the counter output signal 104. In another embodiment, the PLLs 103, 105, 107, etc., receive a counter output signal from a different counter (similar to 110) as the reference clock, respectively, and all the counters are operated by the same clock signal 102. In this way, as long as the different counters are configured to count in response to the same clock signal 102, the PLLs 103, 105, 107 also remain synchronized.

For PLLs on different circuit chips 101 and 111, each chip 101 or 111 is respectively configured to host a crystal counter 110 or 120. Similar to the PLLs on circuit chip 101, PLLs 113, 115, 117, etc. on the circuit chip 111 are configured to receive the counter output signal 114 from the counter 120 and generate output signals that have their respective phases "locked" to the phase of the same counter output signal 114. To synchronize the signal phases of PLLs on the circuit chip 101 and PLLs on the circuit chip 111, a reset unit 130 is configured to generate and simultaneously send a reset signal 131, 132 to reset and synchronize, in an embodiment, the counters 110 and 120 on different circuit chips such that the counters 110 and 120 are configured to restart with respect to the same crystal clock edge. In some embodiments, the reset unit 130 is configured to send reset signals periodically, intermittently and/or continuously. In an embodiment, the circuit chips 101 and 111 are operated by individual power-on-reset signals. Thus, as long as the circuit chips 101 and 111 are kept powered-on with the counters 110 and 120, even when the PLLs 103, 105, 107, 113, 115 or 117 are temporarily shut down, the counters 110 and 120 remain synchronized.

In this way, as the counter time stamp captured in the counter output signal 104 or 114 is independent of the PLL reset, channel change, oscillator ambiguity (e.g., interference between oscillators operated at different frequencies, etc.) within each PLL and/or the divider initial phase within each PLL, and is only determined by the clock edge of the crystal clock signal 102 for the counter 110 and 120, respectively. In addition, as the crystal clock signal 102 typically has a frequency below 100 MHz, the additional power consumption by adding an extra counter 110 to the circuit is rather insignificant.

It is noted that the two circuit chips 101 and 111 are for illustrative purpose only. A different number of circuit chips can be connected in a similar manner as shown with respect to 101 and 111 so as to share a common reset signal from reset 130.

FIG. 2 is a block diagram illustrating an example sigma-delta modulator (SDM) configured to employ a counter output signal, generated from the counter shown in FIG. 1, to synchronize the phase of the fractional part of a division signal, according to some embodiments described herein. An SDM is sometimes configured to convert a high-bit count digital signal into a low-bit count digital signal. For example, a high-bit count frequency control word (FCW), including bits representing the integer part 211 and bits representing the fractional part 212, is modulated, by the SDM, onto a divisional ratio signal 218 corresponding to the FCW. As further described in FIG. 3, the SDM is used to provide the division ratio signal 218 to a multi-modulus divider (MMDIV) 330 in a fractional-N generation PLL.

As shown at circuit 201, conventionally, an SDM includes an integrator 205 (e.g., a delay feedback loop) to integrate the fractional part of the FCW 212 continuously. The integrated output from the integrator 205 is then passed through a quantizer 206 and then the quantized output from the quantizer 206 is sent to an adder 210. The integer part of the FCW 211 is added to the integrated and quantized fractional part of the FCW 212 at the adder 210. In this way, the division ratio signal 218 is generated from the adder 210 over the period of time. The integrator 205 is often operated under a feedback clock signal, which typically varies between different PLLs, and thus the division ratio signal 218 across different PLLs is not synchronized. Hence, inasmuch as multiple PLLs sometimes experience different divider output edges due to different feedback clock edges even when each of the multiple PLLs is fed a given reference clock, the phases of different PLLs are thus unsynchronized.

In circuit 202, the component 215 that includes a multiplier 208 replaces the conventional integrator 205. In circuit 202, a counter output signal 104, e.g., as generated from the crystal counter 110 in FIG. 1, is fed to a multiplier 208, which multiplies the fractional part of the FCW 212 with the counter output signal 104. By multiplying the fractional part of the FCW 212 to the counter output signal 104, the fractional part of the FCW 212 is sent to the adder 210 in an equivalent way as the signal from the integrator 205. For example, instead of integrating the fractional part of the FCW (denoted by $\Delta f$) over time and outputting the fractional part as $2\Delta f, 3\Delta f, 4\Delta f, \ldots$, the multiplier 208 is configured to multiply $\Delta f$ with a counter value directly, and generate an output equivalent to $2\Delta f, 3\Delta f, 4\Delta f, \ldots$. The output from the component 215, e.g., the product of the fractional part of the FCW 212 and the counter output signal 104, is then fed to a feedback circuit. Although the feedback circuit includes the quantizer 206 in the forward loop, but the integrator 205 is disposed in the negative feedback loop to integrate a feedback signal at the circuit 202, in an embodiment. As the counter output signal 104 is also fed to the PLL as a reference clock (e.g., see 104, 114 in FIG. 1), the multiplier 208 is then configured to generate an output to the SDM, e.g., the integrator 205 and the quantizer 206, in synchronization with the reference clock of the PLL. By synchronizing the division ratio signal 218 with the counter output signal 104, the division ratio signal 218 in the FCW is also in synchronization with the reference clock of the PLL.

The component 215 is configured to lock a stable output for the fractional part of the FCW to the adder 210. Specifically, by using the counter output signal 104 as a clock to the fractional part of the FCW 212, the multiplier output has a stable output clocked at the counter output signal 104 that is oblivious to other PLL transient noise or channel hopping. For example, when channel hopping occurs during a clock period of the counter output signal 104, the FCW changes from $FCW_1$ to $FCW_2$ at a first time instance $t_1$ and changes back to $FCW_1$ at a second time instance $t_2$. However, as the counter value corresponding to the counter output signal 104 remains the same as if FCW had not changed, when the channel changes back to $FCW_1$, $FCW_1 \times$ counter value ($t_2$) has the same phase as if the channel stays unchanged at $FCW_1$ until the second time instance $t_2$.

Similar to circuits 101 and 111 in FIG. 1, within a circuit chip, the counter output signal 104 is distributed to each SDM within each PLL. For SDMs disposed on different circuit chips, each circuit chip employs a crystal counter to generate a counter output signal 104, the output signal 104 being synchronized among circuit chips using the same reset signal (131, 132 in FIG. 1).

In some embodiments, the counter output signal 104 is configured to update at the clock 301, and the SDM operates at a feedback clock (not shown in FIG. 2). When the two clock domains are different, the counter output signal 104 is re-sampled, via a sampler (not shown), to match the feedback clock before feeding to SDM.

Figure 3:
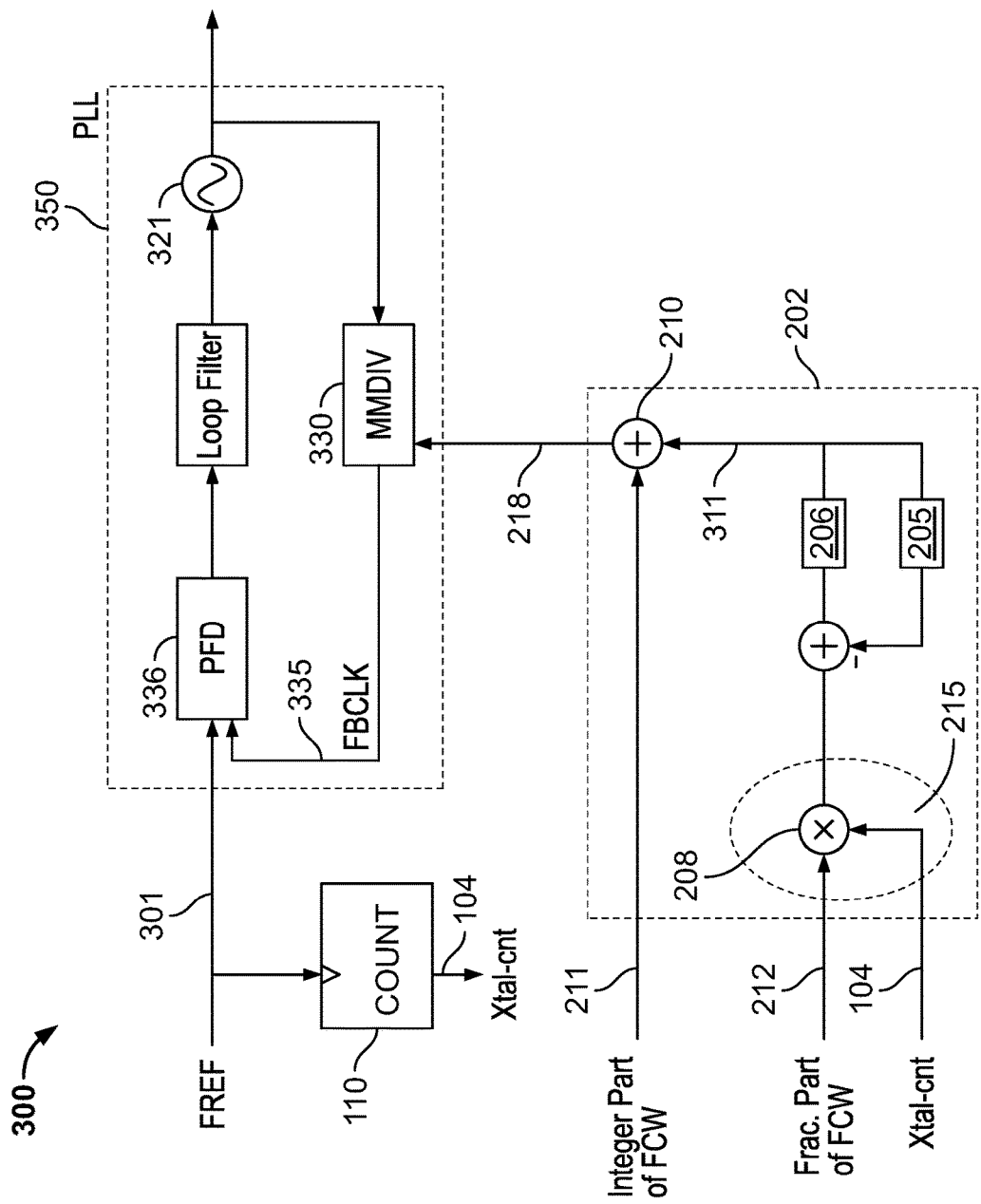
FIG. 3 is a block diagram illustrating an example PLL employing an SDM with a phase synchronization component as shown in FIG. 2, according to some embodiments described herein.
Figure 4:
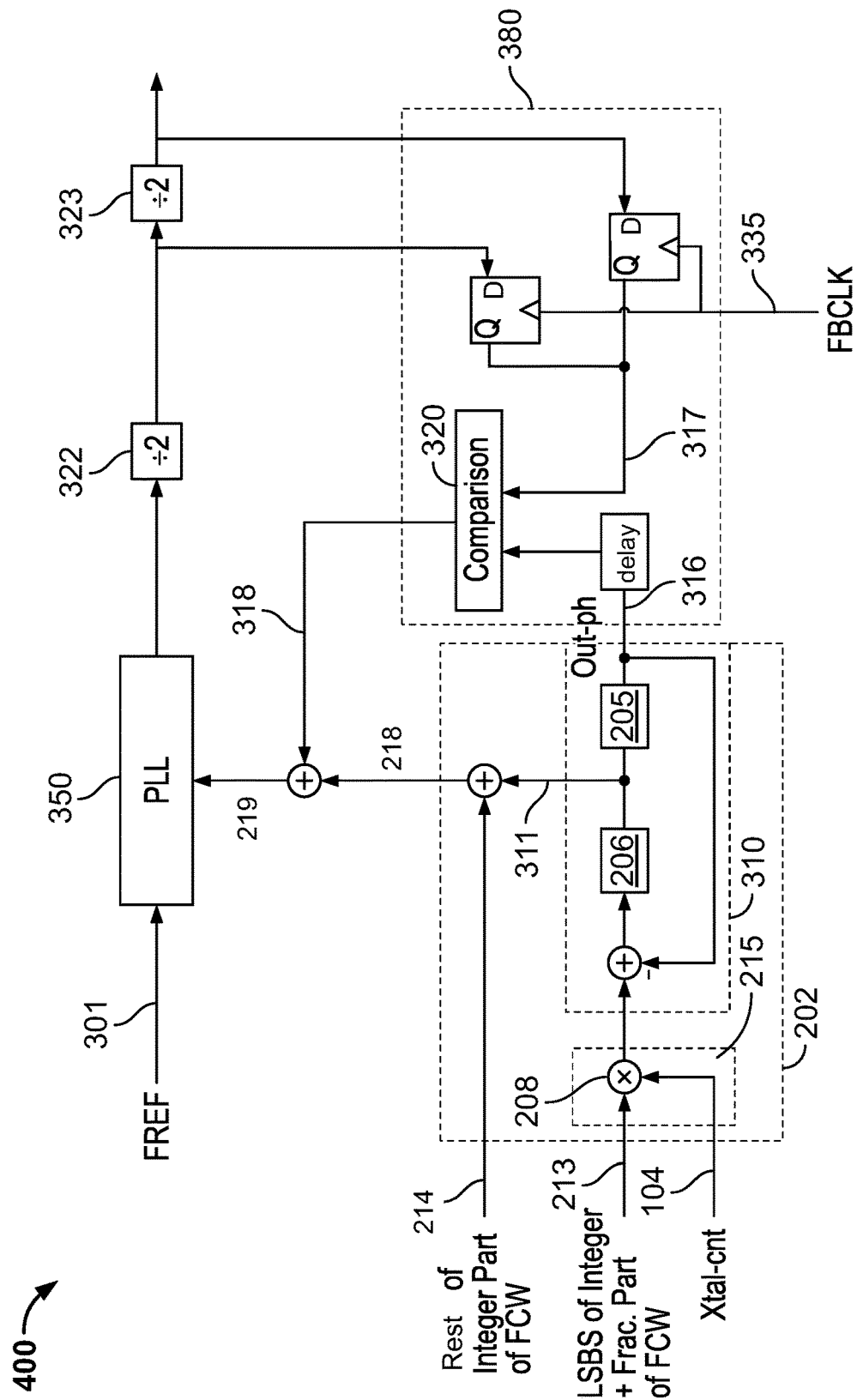
FIG. 4 is a block diagram illustrating an error correction circuit for correcting the phase error caused by dividers at the output of a PLL (e.g., as shown in FIG. 3), according to some embodiments described herein.

FIG. 3 is a block diagram illustrating an example PLL employing an SDM with a phase synchronization component as shown in FIG. 2, according to some embodiments described herein. The circuit 300 shows a PLL 350, which can be any of the PLLs 103, 105, 107, 113, 115 or 117 in FIG. 1. Similar as described in FIG. 1, the PLL 300 is configured to receive a reference clock 301 (equivalent to the crystal clock that operates the counter output signal 104 in FIG. 1) from the crystal counter 110. For example, the PLL 300 includes a phase/frequency detector (PFD) 336 that is configured to compare the reference clock 301 and a feedback clock 335. The PFD 336 then detects the phase difference between the reference clock 301 and a feedback clock 335 and sends a signal representing the phase difference to an output oscillator 321. The oscillator 321 is then configured to control the phase of the oscillator clock generated from the oscillator 321 to be fixed relative to the reference clock 301.

As the oscillator 321 generates an oscillator clock that has a different frequency with the reference clock 301, the MMDIV 330 is configured to divide the oscillator clock from the oscillator 321 to generate a feedback clock 335 that has a matching frequency with the reference clock 301. To divide the oscillator clock from the oscillator 321, the MMDIV 330 is configured to sample the received oscillator clock according to a division ratio signal 218. For example, when the division ratio is a non-integer value, e.g., $2\frac{1}{4}$, $1\frac{1}{4}$, etc., the MMDIV 330 is configured to skip sampling the oscillator clock at a certain rate to approximate the fractional ratio, e.g., skipping one oscillator clock period every five sampling clock periods to approximate the division ratio of 5/4, etc. The FCW represents the division ratio between the frequency corresponding to the output signal from oscillator 321 and the reference clock 301.

The division ratio signal 218 is generated in a similar manner as shown at 202 in FIG. 2. The fractional part 212 of the FCW is multiplied with the counter output signal 104. In this way, the oscillator clock from the oscillator 321 is sampled at MMDIV 330 at a synchronized phase with the counter output signal 104. Similarly, in FIG. 3, the fractional part of the FCW 212 is included as the multiplier input to be fed to the multiplier 208, which is configured to multiply the FCW 212 with the counter output signal 104. The output from the multiplier 208 is then fed to the quantizer 206, with a feedback loop having the integrator 205, as shown in FIG. 2. The output 311 from the quantizer 206 is then added to the integer part of the FCW 211 at the adder 210, which is configured to generate the division ratio signal 218 for the MMDIV 330.

FIG. 4 is a block diagram illustrating an error correction circuit for correcting the phase error caused by dividers at the output of a PLL (e.g., as shown in FIG. 3), according to some embodiments described herein. At the circuit 400, the output signal from the PLL 350 is further divided, and thus the integer part of the FCW and the fractional part of the FCW correspond to a division ratio between the divided output from the divider 323 in FIG. 4 (instead of the output from the oscillator 321) and the reference clock 301. Thus, in an embodiment, the input 213 may also include a number of the least significant bits (LSBs) of the integer part 211 (e.g., see integer part 211 of the FCW in FIG. 3) of the FCW based on the number of dividers (e.g., see 322, 323 in FIG. 4) used at the output of the PLL 350, and the same LSBs of the integer part of the FCW that are included at input 213 are omitted from input 214, which equals the integer part 211 of the FCW excluding the LSBs. In the example shown in FIG. 4, as two half-dividers 322-323 are used at the output end of the PLL 350, the input 213 includes the fractional part of the FCW and two LSBs of the integer part of the FCW, and the input 214 includes integer part of the FCW excluding two LSBs.

Similar to FIG. 3, the input 213 is multiplied to the counter output signal 104, and the product is passed through an SDM 310 to generate the SDM output 311, e.g., at the output of the quantizer 206 (which is the same as the quantizer 206 shown in FIGS. 2-3). The SDM output 311 is then added to the remaining integer part of the FCW 214.

An error correction block 380 is used to correct the error in the phase of any dividers outside the PLL 350. The error correction block 380 is configured to receive the phase output signal 316 from the SDM 310, and generate an error signal 318, which is combined after the adder 210 to correct the phase of signals coming from dividers outside the PLL 350.

As out_ph 316 is obtained from the multiplier output which is synchronized with the counter output signal 104, the out_ph 316 is used as a phase reference to synchronize divided oscillator clock from the oscillator 321. For example, two serially connected half dividers 322 and 323 are configured to divide the oscillator clock from the oscillator 321 to obtain the divided oscillator clock. The divided oscillator clock is then sampled by a feedback clock 335 by flip-flops, and then fed to a comparator 320 with the out_ph 316. The comparator 320 is configured to compare corresponding samples between the phase 317 of the divided oscillator clock and the out_ph 316. To align the comparison, a delay is applied to the signal 316 before the signal 316 is fed to the comparator 320 to account for the delay through the MMDIV 330 and the flip-flops generating the signal 317. An error component 318 is generated by the comparator 320 by comparing the delayed out_ph 316 and the signal 317 sampled by the feedback clock 335. The error component 318 thus represents the phase difference between the divided oscillator clock from the oscillator 321 and the counter output signal 104, as the out_ph 316 is synchronized with the counter output signal 104.

In some embodiments, the error component 318 experiences a similar latency (e.g., through the MMDIV 330 and the flip-flops generating the signal 317) before the error component 318 has an effect on the signal 317 via the feedback loop. When the comparator 320 attempts to correct the phase difference, due to the latency, additional phase errors may occur in the PLL. To account for the latency in the error component 318, the comparator 320 is configured to account for the last few cycles of the comparator output (e.g., the number of cycles required depends on the total latency the error component 318 experiences) by producing an output of zero during these few cycles, or by taking the sum of the recent comparator outputs and subtracting the sum from the current comparator output.

The adder 210 is configured to add the output 311 from the SDM 310 that represents the fractional part of the FCW and the LSBs of the integer part of the FCW to the remaining bits 214 of the integer part of the FCW 211. The error component 318 representing the phase difference of the divided oscillator clock from the dividers 322-323, is further added to the output 218 of the adder to generate the division ratio signal 219 for the PLL 350 (e.g., the division ratio signal 219 is fed to the MMDIV 330 within the PLL 350, as shown in FIG. 3). The same feedback clock 335 as used at PFD 336 is used to obtain the phase of dividers 322-323. Thus, whenever the oscillator 321 is not synchronized with the reference clock 301, the phase difference from the oscillator 321 is fed through the dividers 322 and 323 into the comparator 320. The oscillator phase difference is thus corrected over time by compensating the division ratio signal 218 with the error component 318 from the comparator. In this way, the oscillator 321 is synchronized with the counter output signal 104. Once the feedback loop including the dividers 322, 323 and the comparator 320 settles (e.g., at a stable state when the oscillator output is locked to the reference clock 301), the error component 318 should be zero, and the PLL 300 and the dividers output phase 317 are also synchronized with the reference clock 301.

It is noted that for illustrative purpose only, two half-dividers 322, 323 are shown in FIG. 3, but any number N half-dividers can be used to divide the oscillator output by 2N. When N half-dividers are used to divide the oscillator output, an exact number N of the LSBs of the integer part of the FCW are to be included in the input 213 with the fractional part of the FCW, and the N LSBs are omitted from the input 214 (e.g., input 214 include the integer part of the FCW excluding the N LSBs).

For multiple PLLs (e.g., see 103, 105, 107 in FIG. 1) with their own respective dividers in LO distribution path, as long as the SDM phase is controlled by the same counter output signal 104, the oscillator phase and dividers phase are then all synchronized to the reference clock 301.

Figure 5:
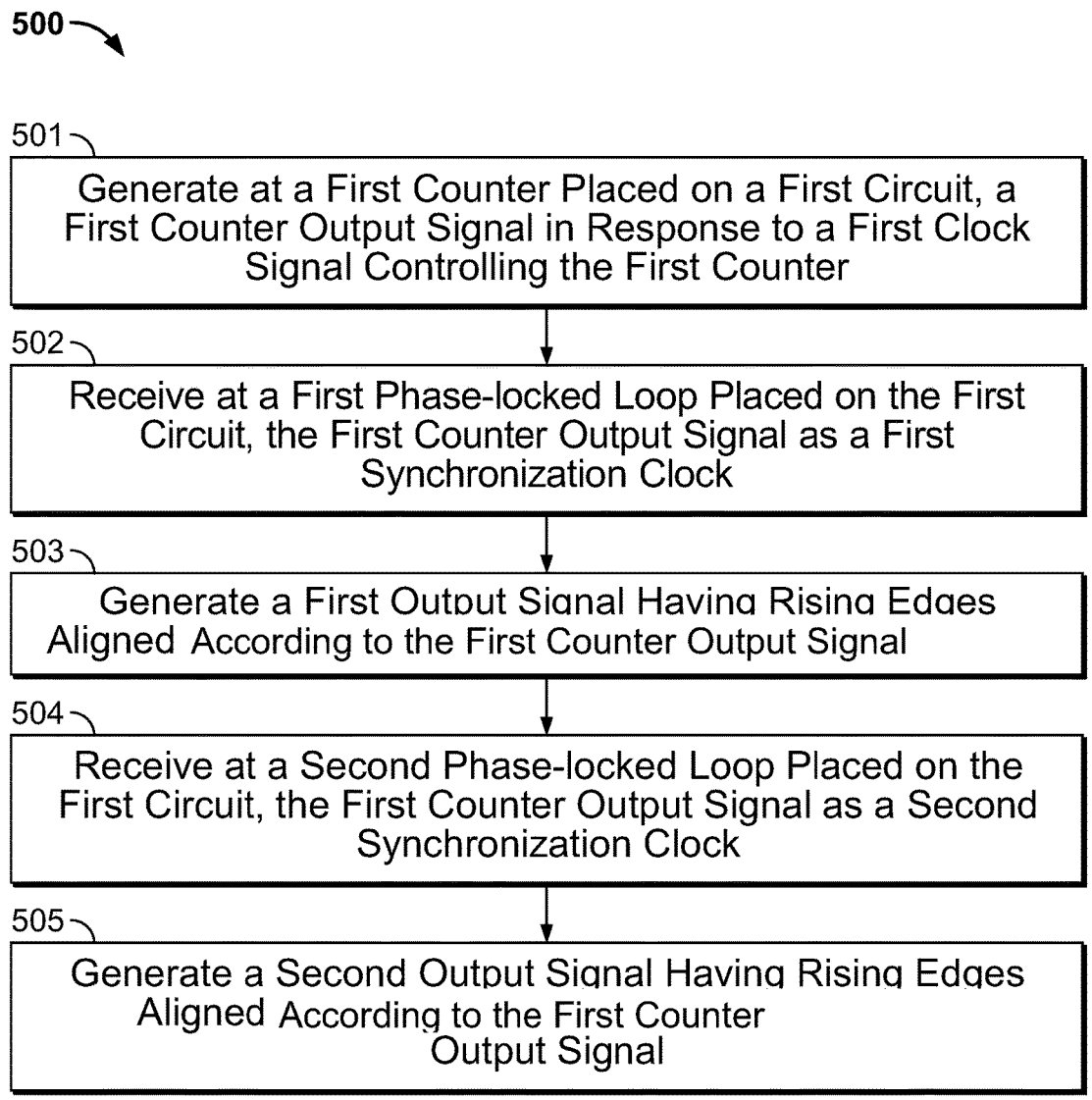
FIG. 5 is a logic flow diagram illustrating an example process of phase synchronization in LO paths implemented by the example circuit as illustrated in FIG. 1, according to some embodiments described herein.

FIG. 5 is a logic flow diagram illustrating an example process 500 of phase synchronization in LO paths implemented by the example circuit as illustrated in FIG. 1, according to some embodiments described herein. At 501, a first counter output signal (e.g., see 104 in FIG. 1) is generated at a first counter (e.g., see 110 in FIG. 1) disposed on a first circuit (e.g., see 101 in FIG. 1), in response to a first clock signal (e.g., see 102 in FIG. 1) controlling the first counter. At 502, the first counter output signal (e.g., see 104 in FIG. 1) is received at a first phase-locked loop (e.g., see 103 in FIG. 1) disposed on the first circuit (e.g., see 101 in FIG. 1) as a first synchronization clock. At 503, a first output signal (e.g., generated from PLL 103 in FIG. 1) having rising edges aligned according to the first counter output signal (e.g., see 104 in FIG. 1) is generated. At 504, the first counter output signal (e.g., see 104 in FIG. 1) is received at a second phase-locked loop (e.g., see 105 in FIG. 1) disposed on the first circuit (e.g., see 101 in FIG. 1) as a second synchronization clock. At 505, a second output signal (e.g., generated from PLL 105 in FIG. 1) having rising edges aligned according to the first counter output signal (e.g., see 104 in FIG. 1) is generated.

Figure 6:
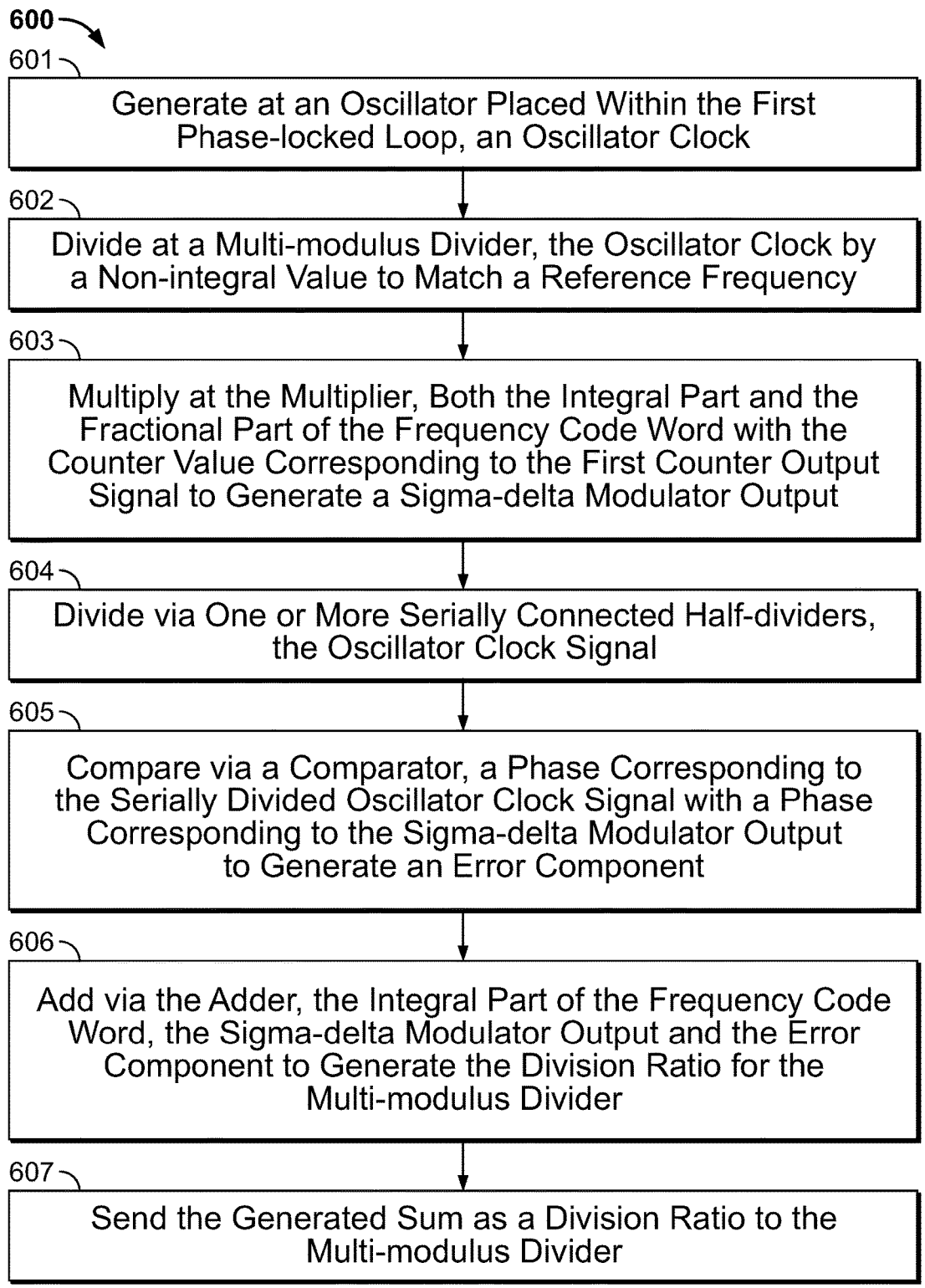
FIG. 6 is a logic flow diagram illustrating an example process of operating an SDM with phase synchronization implemented by the example circuits illustrated in FIGS. 2-4, according to some embodiments described herein.

FIG. 6 is a logic flow diagram illustrating an example process 600 of operating an SDM with phase synchronization implemented by the example circuits illustrated in FIGS. 2-4, according to some embodiments described herein. At 601, an oscillator clock is generated at an oscillator (e.g., see 321 in FIG. 3) disposed within the first phase-locked loop (e.g., see 300 in FIG. 3). At 602, the oscillator clock is divided dividing at a multi-modulus divider (e.g., see 330 in FIG. 3) by a non-integer value (e.g., see division ratio 318 in FIG. 3) to match a reference frequency (e.g., see 301 in FIG. 3). At 603, both the integer part and the fractional part of the frequency control word (e.g., see 213 in FIG. 3) are multiplied at the multiplier (e.g., see 208 in FIG. 3) with the counter value corresponding to the first counter output signal (e.g., see 104 in FIG. 3) to generate a sigma-delta modulator output (e.g., see 311 in FIG. 3). At 604, the oscillator clock signal is divided via one or more serially connected half-dividers (e.g., see 322, 323 in FIG. 3). At 605, a phase corresponding to the serially divided oscillator clock signal (e.g., see 317 in FIG. 3) is compared, via a comparator (e.g., see 320 in FIG. 3), with a phase (e.g., see 316 in FIG. 3) corresponding to the sigma-delta modulator output (e.g., see 311 in FIG. 3) to generate an error component (e.g., see 318 in FIG. 3). At 606, the integer part of the FCW (e.g., see 211 in FIG. 3) is added, via the adder (e.g., see 210 in FIG. 3), to the sigma-delta modulator output (e.g., see 311 in FIG. 3) and the error component (e.g., see 318 in FIG. 3) to generate the division ratio (e.g., see 218 in FIG. 3) for the multi-modulus divider (e.g., see 330 in FIG. 3). At 607, the generated sum as a division ratio (e.g., see 218 in FIG. 3) is sent to the multi-modulus divider (e.g., see 330 in FIG. 3).

Various embodiments discussed in conjunction with FIGS. 1-6 are performed by various electronic components of one or more electronic circuits, such as but not limited to an integrated circuit, DSP, and/or the like. Various components discussed throughout this disclosure such as, but not limited to latches (e.g., 101, 102 in FIG. 1), XOR gates (e.g., 124 in FIG. 1, 224 in FIS. 2), and/or the like, are configured to include a set of electronic circuit components, and communicatively operate on one or more electronic circuits. Various electronic circuits discussed herein are configured to include any of, but not limited to logic gates, memory cells, amplifiers, filters, and/or the like. Various embodiments and components disclosed herein are configured to be at least partially operated and/or implemented by processor-executable instructions stored on one or more transitory or non-transitory processor-readable media.

While various embodiments of the present disclosure have been shown and described herein, such embodiments are provided by way of example only. Numerous variations, changes, and substitutions relating to embodiments described herein are applicable without departing from the disclosure. It is noted that various alternatives to the embodiments of the disclosure described herein may be employed in practicing the disclosure. It is intended for the following claims to define the scope of the disclosure and that methods and structures within the scope of these claims and their equivalents are to be covered thereby.

While operations are depicted in the drawings in a particular order, this is not to be construed as requiring that such operations be performed in the particular order shown or in sequential order, or that all illustrated operations be performed to achieve the desirable results.

The subject matter of this specification has been described in terms of particular aspects including components, functionalities and operations, but other aspects including components, functionalities and operations can be implemented and are within the scope of the following claims. For example, the operations recited in the claims can be performed in a different order and still achieve desirable results. As one example, the process depicted in FIG. 6 does not necessarily require the particular order shown, or sequential order, to achieve desirable results. In certain implementations, multitasking and parallel processing may be advantageous. Other variations are within the scope of the following claims.

What is claimed is:
1. A system having phase synchronized local oscillator paths, the system comprising:
a first circuit including:

a first counter configured to generate a first counter output signal in response to a first clock signal controlling the first counter;

a first phase-locked loop coupled to the first counter, the first phase-locked loop being configured to receive the first counter output signal as a first synchronization clock for the first phase-locked loop and to generate a first output signal having rising edges aligned according to the first counter output signal;

an oscillator configured to generate an oscillator clock;

a multi-modulus divider configured to divide the oscillator clock by a non-integer value to match a reference frequency;

a first sigma-delta modulator including:
  a multiplier configured to generate a multiplier output signal representing a product of a fractional part of a frequency control word and the first counter output signal;
  an adder configured to generate a sum of an integer part of the frequency control word and the generated product of the fractional part of the frequency control word and the counter value corresponding to the first counter output signal, send the generated sum as a division ratio to the multi-modulus divider; and
  a sampler configured to sample the first counter output signal to match a modulator clock signal controlling the first sigma-delta modulator when a frequency of the first counter output signal and a frequency of the modulator clock signal are different.

2. The system of claim 1, wherein the first circuit further comprises:
  a second phase-locked loop coupled to the first counter, the second phase-locked loop being configured to receive the first counter output signal as a second synchronization clock and generate a second output signal having rising edges aligned according to the first counter output signal.

3. The system of claim 1, wherein the first circuit further comprises:
  a second counter configured to receive the first clock signal as an input clock and to generate a second counter output signal according to the first clock signal;
  a second phase-locked loop coupled to the second counter, the second phase-locked loop being configured to receive the second counter output signal, the second counter output signal serving as a second synchronization clock for the second phase-locked loop, and to generate a second output signal having rising edges aligned according to the second counter output signal.

4. The system of claim 1, wherein the first counter is implemented as a multi-bit counter, and wherein the first counter is configured to generate the first counter output signal in response to the first clock signal irrespective of whether the first phase-locked loop is powered on or powered off.

5. The system of claim 1, wherein the multiplier is further configured to multiply a number of least significant bits of the integer part of the frequency control word and the fractional part of the frequency control word with the counter value corresponding to the first counter output signal to generate a sigma-delta modulator output, and wherein the first circuit further includes:
  one or more serially connected half-dividers configured to divide the oscillator clock signal consecutively;
  a comparator configured to compare a phase corresponding to a feedback signal derived from the serially divided oscillator clock signal with a phase corresponding to the sigma-delta modulator output to generate an error component indicative of a phase difference between the feedback signal and the sigma-delta modulator output; and
  the adder configured to add the integer part of the frequency control word excluding a number of least significant bits of the integer part of the frequency control word, the sigma-delta modulator output and the error component to generate the division ratio for the multi-modulus divider.

6. The system of claim 5, wherein the number of least significant bits of the integer part of the frequency control word that are combined with the fractional part of the frequency control word is determined by a number of the one or more serially connected half-dividers used to divide the oscillator clock signal.

7. The system of claim 5, further comprising:
  one or more flip-flops governed by a feedback clock, the one or more flip-flops being configured to sample the serially divided oscillator clock signal according to the feedback clock to generate the feedback signal; and
  wherein the first phase-locked loop circuit is further configured to divide the oscillator clock signal by the division ratio, and sample the divided oscillator clock signal with the same feedback clock.

8. The system of claim 1, further comprising:
  a second circuit:
    a second counter configured to generate a second counter output signal in response to a second clock signal controlling the second counter,
    a second phase-locked loop coupled to the second counter, the second phase-locked loop being configured to receive the second counter output signal as a second synchronization clock and generate a second output signal having rising edges aligned according to the second counter output signal, and
  a reset component coupled to the first circuit and the second circuit, wherein the reset component is configured to send a same reset signal to synchronize the first counter on the first circuit and the second counter on the second circuit.

9. A method for phase synchronization in local oscillator paths, the method comprising:
  generating, at a first counter disposed on a first circuit, a first counter output signal in response to a first clock signal controlling the first counter;
  receiving, at a first phase-locked loop disposed on the first circuit, the first counter output signal as a first synchronization clock for the first phase-locked loop;
  generating a first output signal having rising edges aligned according to the first counter output signal;
  generating, at an oscillator disposed within the first phase-locked loop, an oscillator clock;
  dividing, at a multi-modulus divider, the oscillator clock by a non-integer value to match a reference frequency;
  generating, at a multiplier disposed within a first sigma-delta modulator, a multiplier output signal representing a product of a fractional part of a frequency control word and a counter value corresponding to the first counter output signal;
  generating, at an adder disposed within the first sigma-delta modulator, a sum of an integer part of the frequency control word and the generated product of the fractional part of the frequency control word and the counter value corresponding to the first counter output signal;

sending the generated sum as a division ratio to the multi-modulus divider; and sampling the first counter output signal to match a modulator clock signal controlling the first sigma-delta modulator when a frequency of the first counter output signal and a frequency of the modulator clock signal are different.

10. The method of claim 9, further comprising:

receiving, at a second phase-locked loop co-located at the first circuit and coupled to the first counter, the first counter output signal as a second synchronization clock; and generating a second output signal having rising edges aligned according to the first counter output signal.

11. The method of claim 9, further comprising:

receive, at a second counter co-located on the first circuit, the first clock signal as an input clock for the second counter;

generate, at the second counter, a second counter output signal in response to the first clock signal;

receiving, at a second phase-locked loop coupled to the second counter, the second counter output signal as a second synchronization clock; and generating a second output signal having rising edges aligned according to the second counter output signal.

12. The method of claim 9, wherein the first counter is implemented as a multi-bit counter, further comprising:

generate, via the first counter, the first counter output signal in response to the first clock signal irrespective of whether the first phase-locked loop is powered on or powered off.

13. The method of claim 9, further comprising:

multiplying, at the multiplier, a number of least significant bits of the integer part of the frequency control word and the fractional part of the frequency control word with the counter value corresponding to the first counter output signal to generate a sigma-delta modulator output;

dividing, via one or more serially connected half-dividers, the oscillator clock signal;

comparing, via a comparator, a phase corresponding to a feedback signal derived from the serially divided oscillator clock signal with a phase corresponding to the sigma-delta modulator output to generate an error component indicative of a phase difference between the feedback signal and the sigma-delta modulator output; and adding, via the adder, the integer part of the frequency control word excluding a number of least significant bits of the integer part of the frequency control word, the sigma-delta modulator output and the error component to generate the division ratio for the multi-modulus divider.

14. The method of claim 13, wherein the number of least significant bits of the integer part of the frequency control word that are combined with the fractional part of the frequency control word is determined by a number of the one or more serially connected half-dividers used to divide the oscillator clock signal.

15. The method of claim 13, further comprising:

sampling, via one or more flip-flops operated by a feedback clock, the serially divided oscillator clock signal according to the feedback clock to generate the feedback signal;

dividing, via a multi-modulus divider within the first phase-locked loop, the oscillator clock signal by the division ratio; and sampling the divided oscillator clock signal with the same feedback clock.

16. The method of claim 9, further comprising:

generating, at a second counter disposed on a second circuit, a second counter output signal in response to a second clock signal controlling the second counter;

receiving, at a second phase-locked loop disposed on the second circuit, the second counter output signal as a second synchronization clock;

generating a second output signal having rising edges aligned according to the second counter output signal; and receiving, at the first counter on the first circuit and the second counter on the second circuit, a same reset signal to synchronize the first counter and the second counter.

* * * * *